United States Patent [19]
Gault

[11] 4,083,748
[45] Apr. 11, 1978

[54] METHOD OF FORMING AND GROWING A SINGLE CRYSTAL OF A SEMICONDUCTOR COMPOUND

[75] Inventor: William Andrew Gault, Ewing Township, Mercer County, N.J.

[73] Assignee: Western Electric Company, Inc., New York, N.Y.

[21] Appl. No.: 627,319

[22] Filed: Oct. 30, 1975

[51] Int. Cl.² .................. B01J 17/20; B01J 17/22; C01G 15/00
[52] U.S. Cl. .................. 156/609; 156/616 R; 156/616 A; 156/617 V; 156/624; 156/DIG. 70; 156/DIG. 72
[58] Field of Search .............. 156/DIG. 70, DIG. 77, 156/DIG. 72, DIG. 82, 616 A, 616 R, 609, 617 R, 617 H, 617 SP, 617 V, 624

[56] References Cited
U.S. PATENT DOCUMENTS

| | | | |
|---|---|---|---|
| 3,305,313 | 2/1967 | Sirgo | 156/616 A |
| 3,520,810 | 7/1970 | Plaskett | 156/616 A |
| 3,627,499 | 12/1971 | LeDuc | 156/609 |
| 3,649,193 | 3/1972 | Deyris | 156/609 |
| 3,853,487 | 12/1974 | Meuleman | 156/616 A |
| 3,944,393 | 3/1976 | Schierding | 156/616 A |

FOREIGN PATENT DOCUMENTS

| | | | |
|---|---|---|---|
| 1,242,410 | 8/1971 | United Kingdom | 156/622 |
| 1,352,449 | 5/1974 | United Kingdom | 156/617 SP |
| 1,353,917 | 5/1974 | United Kingdom | 156/617 SP |
| 1,430,480 | 3/1976 | United Kingdom | 156/616 |

Primary Examiner—Stephen J. Emery
Attorney, Agent, or Firm—J. Rosenstock

[57] ABSTRACT

A method of forming and growing a single crystal of a semiconductor compound comprising a Group II-VI or Group III-V compound is disclosed. The method comprises placing a single crystal seed of the semiconductor compound adjacent to a first reactant comprising a Group II or Group III element. A protective blanket, resulting from at least a second reactant of a Group VI or Group V element, is formed over the seed within a temperature zone to protect the seed from dissolution by the first reactant. The reactants are combined to form a melt at a first temperature within the temperature zone and to grow a single crystal from the melt on the seed at a second temperature within the temperature zone.

3 Claims, 2 Drawing Figures

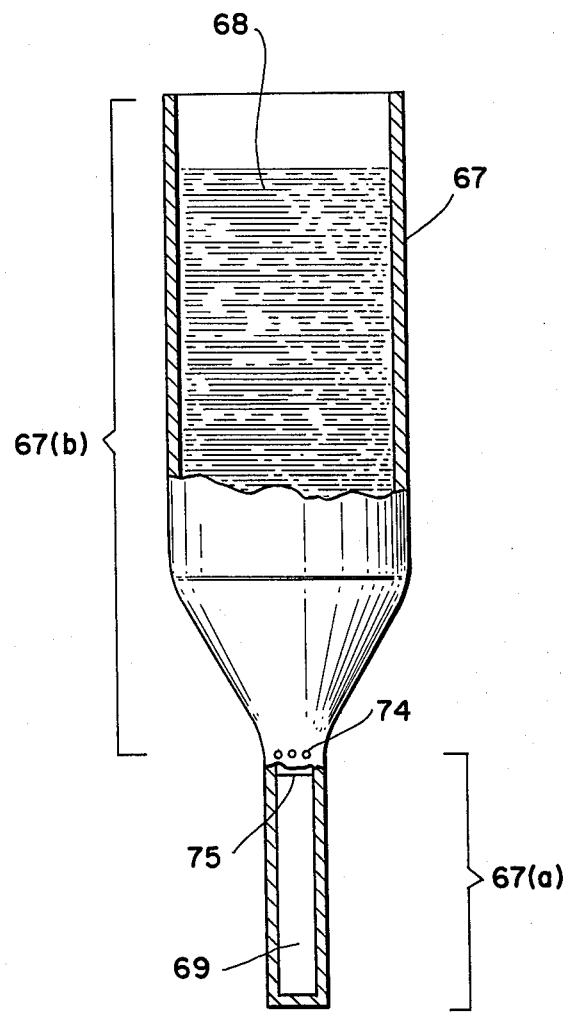

METHOD OF FORMING AND GROWING A SINGLE CRYSTAL OF A SEMICONDUCTOR COMPOUND

BACKGROUND OF THE INVENTION

1. Field of the Invention

This invention relates to a method of forming and growing a single crystal of a semiconductor compound and more particularly, to a method employing a seed crystal of the compound with elemental reactants comprising the compound.

2. Discussion of the Prior Art

There have been many attempts made to produce a single crystal semiconductor compound to be used as a substrate for luminescent diodes, transistors, diodes and the like. These compounds are formed by the combination of an element of Group II or III of the Periodic Table and an element of Group VI or Group V, respectively. Since these elements have a vastly different vapor pressure at a given temperature, there is a great deal of difficulty encountered in the formation of a single crystal of the compound, particularly one large enough to be used as a substrate for semiconductor devices. Furthermore, the reproducibility of prior art processes is rather poor.

U.S. Pat. No. 3,615,203 reveals a method of forming and growing a single crystal of a Group III-V compound. However, a single crystal seed material of the Group III-V compound is not employed and the orientation of the single crystal obtained using this method cannot be predicted. A technique which can form the desired compound from its elements and grown a single crystal of predictable orientation from a seed material, without appreciable dissolution thereof, is therefore desired.

SUMMARY OF THE INVENTION

This invention relates to a method of forming and growing a single crystal of a semiconductor compound and more particularly, to a method employing a seed crystal of the compound with elemental reactants comprising the compound.

The method comprises placing a single crystal seed of the semiconductor compound, comprising a Group II-VI or Group III-V compound, adjacent to a first reactant comprising a Group II or Group III element. A protective blanket, resulting from at least a second reactant of a Group VI or Group V element, is formed over the seed within a temperature zone to protect the seed from dissolution by the first reactant. The reactants are combined to form a melt at a first temperature within the temperature zone and to grow a single crystal from the melt on the seed at a second temperature within the temperature zone.

BRIEF DESCRIPTION OF THE DRAWINGS

FIG. 2 is a partial isometric view of a vessel of the apparatus of FIG. 1 for containing at least a seed crystal material of the semiconductor compound.

DETAILED DESCRIPTION

Figure 1:
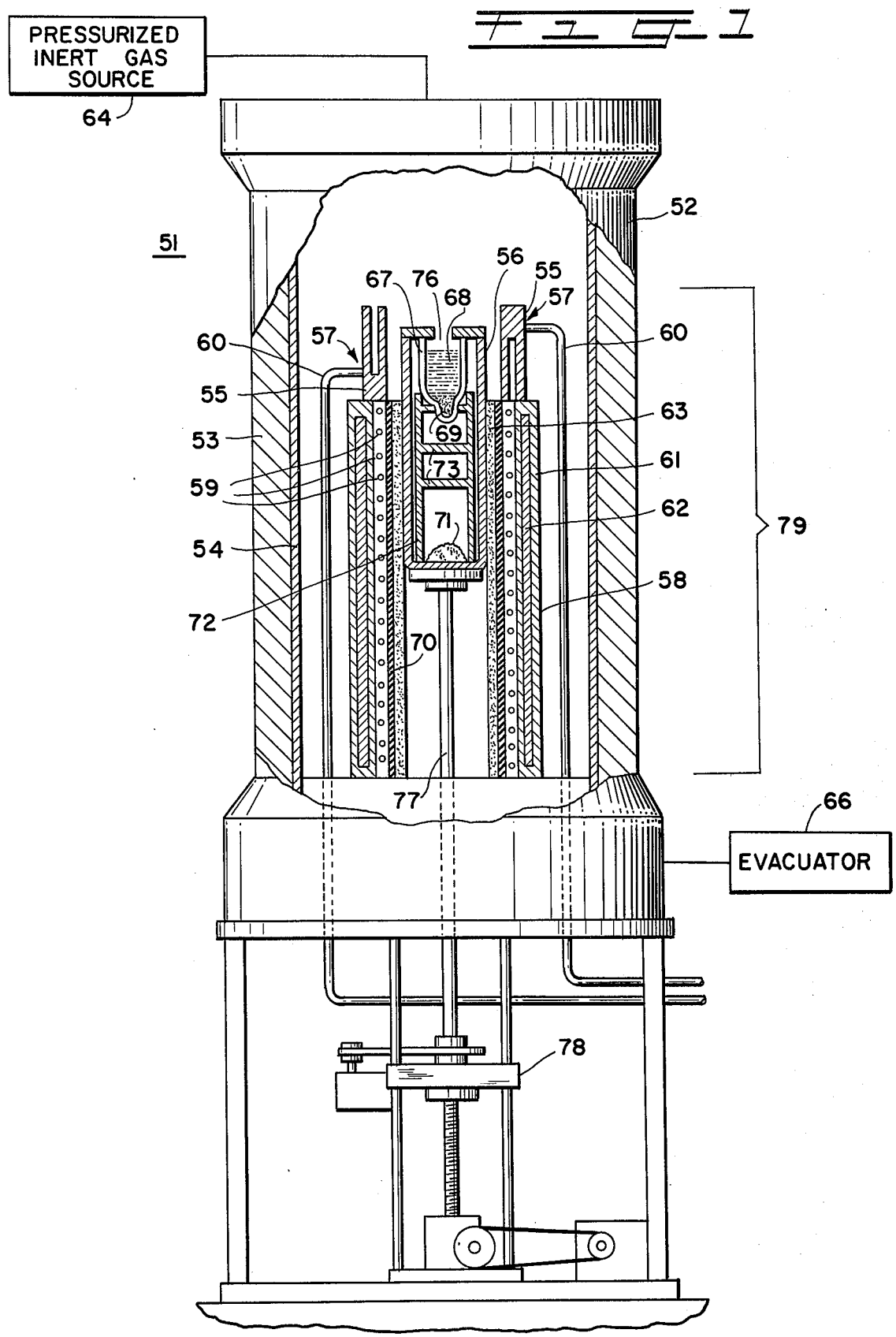
FIG. 1 is a partial isometric view of an apparatus for growing a single crystal semiconductor compound according to the invention.

The present invention has been described largely in terms of growing GaP. However, it will be understood that such description is for purposes of exposition and not for purposes of limitation. It will be readily appreciated that the inventive concept described is equally applicable to other compounds comprising either Group II elements and Group VI elements or Group III elements and Group V elements of the Periodic Table of Elements as set forth in the Mendelyeev Periodic Table appearing on page B2 in the 45th edition of the "Handbook of Chemistry and Physics," published by the Chemical Rubber Company.

Referring now to FIG. 1, there is shown an apparatus 51 of the subject invention. Apparatus 51 comprises a suitable high-pressure autoclave 52, typically comprising a high-strength steel shell 53 with a non-magnetic stainless-steel liner 54, which contains a reaction container 56, and a first and a second radiant and/or conductive heating source, 57 and 58, respectively. Heating source 57 typically comprises a resistance heater element 55 of a "picket fence" configuration, e.g., a graphite cylinder having slots cut longitudinally therein, where each second slot terminates at the bottom portion of the cylinder. Power leads 60 connect element 55 to a power source (not shown). Heating source 58 typically comprises a resistance heater having a wound resistance heating wire 59, e.g., an 80 weight percent Ni, 20 weight percent Cr alloy wire, contained within a non-magnetic shell 61. Shell 61 contains electrical insulation 62, in surrounding relationship to wire 59. Associated with heating source 58 is a heater liner 63, e.g., a graphite liner, designed to equalize the transmission of radiant energy between heating source 58 and reaction container 56. It is of course understood that additional heaters and fixturing thereof can be employed to obtain a desired temperature profile. It is also to be understood that an induction heater may be employed and the invention described herein is not limited to the use of any particular heating means.

Reaction apparatus 51 further comprises a source of inert gas 64 and a chamber evacuator 66, both communicating with the interior of autoclave 52 and being of conventional design.

Reaction chamber 56 comprises a material which is inert to the reactants, e.g., gallium and phosphorus, and the resultant compound, e.g., GaP, ZnS, InP, etc., at the temperatures and pressures destined to be employed for the synthesis and single crystal growth of the Group II-VI or III-V compound. A preferred material comprises pyrolytic boron nitride or quartz. Reaction chamber 56 contains (1) a specially designed vessel 67, e.g., a pyrolytic BN container, which houses a first reactant 68, i.e., a Group II or Group III element, and adjacent thereto a single crystal seed material 69 of the desired semiconductor compound (Group II-VI, Group III-V); (2) a second reactant 71, i.e., a Group VI or Group V element; and (3) an inert spacer element 72 typically comprising alumina or BN, supporting vessel 67 and having baffles 73 between reactants 68 and 71 to minimize temperature gradients in the latter due to emitting radiant energy from the former upon a heating thereof.

Referring to FIG. 2, vessel 67 serves to segregate reactant 68 and single crystal seed material 69 from reactant 72 (FIG. 1). Vessel 67 is designed whereby at least one aperture 74 is formed therein which permits communication of seed material 69 with the ambient contained within the interior of reaction container 56 (FIG. 1). Aperture 74 is typically located in vessel 67 within an area which is at or near the top surface 75 of seed material 69 and which corresponds to a point within a region that serves as a boundary between reactant 68 and single crystal seed material 69. Such a region, of course, may include an interface between material 69 and reactant 68. Aperture 74 has a size sufficient to allow a vapor or gaseous ambient comprising reactant 72 (FIG. 1), e.g., phosphorus, to pass therethrough from the interior of the container 56 (FIG. 1) while at the same time not allowing a melt, e.g., gallium, GaP, etc., destined to be formed, to pass therethrough. In other words, aperture 74 permits passage of essentially only a gas or vapor but does not permit passage of a melt or liquid. The melt or liquid does not traverse aperture 74 because the surface tension of the melt or liquid is sufficiently large to prevent such traversal. Of course, the size of aperture 74 is dependent upon the temperature of the melt and the composition thereof which dictates the surface tension. For the synthesis of GaP at a phosphorus pressure ranging from 1 atmosphere to 50 atmospheres and typically from 30 to 50 atmospheres, and a temperature ranging from about 1100° C. and above, a circular aperture 74 of less than 0.004 inch diameter is typically sufficient. Of course, various surface tensions of the melts and the aperture size required are easily ascertained experimentally by one skilled in the art.

It is of course to be understood that although vessel 67 has been shown as having a plurality of apertures 74, this is for illustrative purposes only and vessel 67 may have only one aperture. In this regard, it is to be noted that vessel 67 may be entirely porous to the passage of a gaseous ambient therethrough whereby apertures or pores are above and below the top surface 75 of seed material 69.

Vessel 67 is necked down whereby single crystal seed material 69 is contained within a lower portion 67(a) which has a much smaller cross-sectional area than the upper portion 67(b) of vessel 67. There are several reasons for situating material 69 in such a manner. The smaller cross-sectional exposure of material 69 to reactant 68 permits better control for dissolution protection to be afforded material 69 during the synthesis of the desired compound as well as reducing the amount of dislocations in the resultant single crystal material which is ultimately obtained. Also, smaller portion 67(a) acts as a heat sink thereby insuring that single crystal growth will take place at the bottom end of vessel 67.

Referring back to FIG. 1, container 56 communicates with the interior of autoclave 52 via aperture 76. Aperture 76 may be at the end of a capillary tube (not shown), as illustrated in *Journal of the Electrochemical Society: REVIEWS AND NEWS,* February 1970, 41C to 47C, at page 46C. Container 56 is seated on a pedestal 77, e.g., a stainless steel pedestal having a graphite base, and may be raised or lowered by conventional means 78, illustratively a motor-driven, worm-gear assembly.

In operation, referring to FIG. 1, reactants 68, e.g., Ga, and 71, e.g., phosphorus, are loaded into autoclave 52, reactant 68 being placed in vessel 67 along with seed material 69, e.g., GaP, and reactant 71 being placed at the bottom of reaction container 56. Autoclave 52 is then pressurized to a desired pressure in excess of one atmosphere, e.g., typically 20 to 56 atmospheres in the synthesis of stoichiometric GaP, by introducing the inert pressurized gas, such as argon, nitrogen, from source 64. Heating source 57 and heating source 58 are energized whereby a temperature zone 79 is created having a temperature gradient therein of decreasing temperature from the top of zone 79 down to the bottom of zone 79. Reactant 71 (Group VI or Group V element) is heated by heating source 58 within zone 79 to a first temperature at or above its volatilization temperature to produce a vapor or gaseous ambient comprising reactant 71 in reaction container 56. Typically, for phosphorus this temperature ranges from 546° C. to 632° C. at a total phosphorus pressure ranging from about 17 atmospheres to about 84 atmospheres (for the stoichiometric synthesis of GaP).

At this point it should be noted that the temperatures and pressures to be employed are dependent upon the type of Group VI or Group V element employed. Where phosphorus is employed, it is to be noted that there are at least six crystal modifications of red phosphorus. In this regard, reference is made to J. R. Van Wazer, *Phosphorus and Its Compounds,* Volume 1, Interscience Publications, Incorporated, New York, 1966, at pages 114 to 119. The pressure-temperature relationship is dependent on the particular phosphorus modification and the exact method of preparation. Red phosphorus (V) is a stable modification above 540° C. and is typically the material employed in a high-pressure synthesis of GaP, InP, etc.

Concurrent with heating reactant 71, reactant 68 contained within vessel 67 is heated within zone 79 by means of heating source 57 to a second temperature at or above the melting point of the desired Group II-VI or Group III-V compound, e.g., gallium phosphide (1466±30° C.), thereby liquifying elemental reactant 68, e.g., gallium, contained in vessel 67 to form a melt thereof.

Referring to FIGS. 1 and 2, the vapor or gaseous ambient formed by heating reactant 71 and comprising reactant 71, passes through aperture 74 of vessel 67 thereby forming a protective blanket over at least the top surface 75 of seed material 69. This blanket protects seed material 69 from dissolution by the resultant melt comprising reactant 68. In other words, a protective barrier is formed between seed material 69 and a melt comprising reactant 68. The protective blanket is formed when the vapor ambient comprising reactant 71, passes through aperture 74, contacts and combines with or reacts with the melt comprising reactant 68 within zone 79 at a temperature below the melting point of the desired compound (below the second temperature). The resultant protective blanket or barrier comprises at least reactant 71 and/or either a polycrystalline form of the desired compound (Group II-VI or III-V) or a melt saturated with reactant 71.

The respective temperatures of the reactants 68, 71 are maintained within zone 79 for a period of time sufficient for a completed reaction to occur between the melt of reactant 68, contained in vessel 67, and reactant 71, comprising the vapor or gaseous ambient in reaction container 56. It is to be understood that a suitable period of time is interdependent upon other parameters such as the reactants employed, the concentrations of each reactant and the temperatures employed. This interdependency is one which is well known to those skilled in the art and a suitable period of time for a particular synthesis of a Group II-VI or Group III-V compound is known or is easily ascertained experimentally, in the light of the disclosure contained herein, by one skilled in the art.

Referring back to FIG. 1, upon completion of the reaction whereby a desired compound is obtained, pedestal 77 and reaction container 56 are raised by means 78 whereby aperture 74 (FIG. 2) of vessel 67 is at the second temperature (above the melting point of the compound), whereby polycrystalline material which may have been formed, as in the protective blanket over the seed material 69, is melted. A continuum of melt or liquid is thus formed, if not already present, within vessel 67 above seed material 69. At the same time, a portion of seed material 69 may be melted to insure that subsequent single crystal growth proceeds from a fresh surface. Seed material 69 will not dissolve at this time because the initial melt (first reactant melt, e.g., liquid gallium) has already been saturated with second reactant 71, e.g., phosphorus, and is converted to the desired compound, e.g., GaP, which is in equillibrium with the compound of seed material 69, e.g., single crystal GaP.

Upon forming a melt continuum above seed 69, reaction container 56 and pedestal 77 are moved downward by means 78 at a suitable rate, e.g., typically 0.25 to 1.5 inches/hr., to bring seed material 69 to a suitable temperature within zone 79 whereby crystallization from the melt can occur. A suitable temperature is at or below the melting point of the desired compound, e.g., for GaP below about 1465° C. When seed material 69 is maintained at the crystallization temperature, single crystal growth from the continuum of compound melt begins on the top surface 75 (FIG. 2) of seed material 69. Continued lowering of the reaction container 56 moves the crystallization temperature and thus single crystal growth from surface 75 of material 69 (FIG. 2) up through the entire region corresponding to the continuum of melt of the compound above seed material 69.

What is claimed is:

1. A method of forming a single crystal Group II-VI or Group III-V compound, which comprises:
    (a) positioning a quantity of a first reactant selected from the group consisting of a Group II element or a Group III element within a vertically disposed crucible house in the upper part of a vertically disposed reaction container, said crucible communicating with the interior of said reaction container through a plurality of apertures located in the lower portion of said crucible;
    (b) positioning in the lower part of said reaction container a source quantity of a second reactant selected from the group consisting of a Group VI element or a Group V element;
    (c) positioning a single crystal seed within the bottom portion of said crucible in contact with said first reactant, the interface between said first reactant and said seed being proximate the level of said plurality of apertures;
    (d) heating to a first temperature the lower part of said reaction container to produce a gaseous ambient comprising said second reactant, said gaseous second reactant passing through said plurality of apertures to contact said first reactant and to form a horizontal protective barrier, between said seed crystal and said first reactant;
    (e) heating at least the upper part of said reaction container to a second temperature to form the compound within said crucible by reaction of said first reactant and said ambient comprising said gaseous second reactant in contact therewith and to form a melt comprising said formed compound in contact with said horizontal protective barrier;
    (f) heating at least the lower portion of said crucible to said second temperature to assure a continuum of said melt comprising said formed compound in contact with said seed crystal; and
    (g) lowering at least said second temperature to a third temperature below said second temperature to expose said contacted melt and seed thereto to crystallize and grow from said contacted melt a single crystal on said seed crystal.

2. The method as defined in claim 1 wherein the compound comprises GaP.

3. The method as defined in claim 2 wherein said melt comprises GaP in stoichiometric proportions.

* * * * *

UNITED STATES PATENT OFFICE
CERTIFICATE OF CORRECTION

Patent No. 4,083,748　　　　　　　Dated April 11, 1978

Inventor(s) William A. Gault

It is certified that error appears in the above-identified patent and that said Letters Patent are hereby corrected as shown below:

In the specification, Column 1, line 33, "grown" should read --grow--. Column 2, line 61, "reactant 72" should read --reactant 71--. Column 3, line 5, "reactant 72" should read --reactant 71--; line 39, "control for" should read --control of--. Column 4, line 29, "1466" should read --1465--.

In the claims, Column 5, claim 1, line 37, "house" should read --housed--.

Signed and Sealed this

Twelfth Day of September 1978

[SEAL]

Attest:

RUTH C. MASON　　　　　　　　DONALD W. BANNER
*Attesting Officer*　　　　*Commissioner of Patents and Trademarks*